US010855238B2

(12) United States Patent
Karnik

(10) Patent No.: US 10,855,238 B2
(45) Date of Patent: Dec. 1, 2020

(54) VOLTAGE OUTPUT OP-AMP PROTECTION CIRCUIT

(71) Applicant: Endress+Hauser SE+Co. KG, Maulburg (DE)

(72) Inventor: Gautham Karnik, Whitestown, IN (US)

(73) Assignee: Endress+Hauser SE+Co. KG, Maulburg (DE)

( * ) Notice: Subject to any disclaimer, the term of this patent is extended or adjusted under 35 U.S.C. 154(b) by 0 days.

(21) Appl. No.: 16/679,944

(22) Filed: Nov. 11, 2019

(65) Prior Publication Data

US 2020/0076386 A1 Mar. 5, 2020

Related U.S. Application Data

(62) Division of application No. 15/860,994, filed on Jan. 3, 2018, now Pat. No. 10,505,506.

(51) Int. Cl.
*H03F 3/45* (2006.01)
*H02H 3/00* (2006.01)
*H03F 1/52* (2006.01)

(52) U.S. Cl.
CPC .......... *H03F 3/45179* (2013.01); *H02H 3/00* (2013.01); *H03F 1/52* (2013.01); *H03F 3/45475* (2013.01); *H03F 3/45659* (2013.01); *H03F 2203/45728* (2013.01)

(58) Field of Classification Search
CPC .... H03F 3/45179; H03F 1/52; H03F 3/45475; H03F 3/45659; H03F 2203/45728; H03F 3/217; H03F 1/523; H03F 2200/78; H03F 3/30; H03F 3/72; H03F 2200/426; H03F 2200/441; H03F 2200/444; H03F 2200/447; H03F 1/0277; H02H 3/00; H03G 3/3042; H03G 1/0088
USPC ............................... 330/51, 207 P, 253, 298
See application file for complete search history.

(56) References Cited

U.S. PATENT DOCUMENTS 9,166,531 B2 * 10/2015 Iijima ................... H03F 1/0261

* cited by examiner

*Primary Examiner* — Khanh V Nguyen
(74) *Attorney, Agent, or Firm* — Mark A. Logan; Endress+Hauser (USA) Holding Inc.

(57) ABSTRACT

The disclosure includes a voltage output circuit for use in a process automation field device, the voltage output circuit including an op-amp configured to supply the output voltage. The output circuit's op-amp is connected to the process automation system though a normally open switch. The normally open switch is closed only when the voltage output circuit is properly powered and operating. An improper connection of a power supply to the voltage output circuit will not power the voltage output circuit, and thus the switch remains open and protects the voltage output circuit from power being drawn in from the improper connection. The disclosure includes also a transceiver circuit having similar power draw protection.

3 Claims, 2 Drawing Sheets

VOLTAGE OUTPUT OP-AMP PROTECTION CIRCUIT

CROSS-REFERENCE TO RELATED APPLICATION

The present application is a divisional application of U.S. patent application Ser. No. 15/860,994, filed on Jan. 3, 2018, the entire contents of which are incorporated herein by reference.

TECHNICAL FIELD

The present disclosure relates generally to field devices including an analog voltage output circuit for use in process automation systems.

BACKGROUND OF THE INVENTION

Process automation field devices may be discrete devices used in a process automation system for the measurement of some physical phenomena. In a conventional field device, the field device may include electronics such as a microcontroller, memory, transducers, and analog-to-digital converters. The field device may include digital and analog outputs, for example, a 4-20 mA current output or a 1-5 V voltage output.

The field device may include wiring terminals by which the field device is connected to the process automation system. The field device may include terminals for power input and additionally include terminals for connection to the field device's 4-20 mA current output or 1-5 V voltage output. Because the field device's terminals are often screw-type terminals to which a stripped wire is connected, it is possible—and not always difficult—to incorrectly connect to the field device to the process automation system. For example, a current meter or a voltmeter to be connected to the field device's output terminals may instead be mistakenly connected to the field device's power input terminals, and a power supply to be connected to the field device's power input terminals may instead be mistakenly connected to the field device's analog output terminals.

In a field device that includes a 1-5 V analog output, the analog output circuit may include an operational amplifier ("op-amp") to produce the 1-5 V analog output voltage. Op-amps typically have a low internal resistance at the output, and mistakenly connecting a power supply to the output terminals of the field device may draw an excessive amount of current into the output of the op-amp and thus burn the op-amp. Such a burned op-amp and output circuit would render the field device essentially unusable.

Various methods have been employed to protect the op-amp from excessive current draw when a voltage is mistakenly connected to the op-amp's output. One method includes placing a fuse in the output circuit that will blow if excessive current passes through the output circuit. However, a blown fuse requires replacement before the field device is again usable, and the fuse replacement generally requires a maintenance technician to access the field device.

Another method to protect the op-amp includes placing a current-limiting resistor in the output circuit. However, the current-limiting resistor may require a re-tuning of any feed-back loop employed with the op-amp. Further, the current-limiting resistor may affect the output voltage when the current-limiting resistor's resistance is comparable to the resistance of the process automation system. For example, if a 4.7 kΩ current-limiting resistor were placed in the output circuit, and if the process automation system's voltmeter had an internal resistance of 1 MΩ, in the voltage divider formed by the current-limiting resistor and the voltmeter, the 4.7 kΩ resistance is negligible:

$$1 \text{ M}\Omega/(4.7 \text{ k}\Omega + 1 \text{ M}\Omega) = 0.995. \quad (\text{Eq. 1})$$

That is, the voltmeter is able to measure 99.5 percent of the 1-5V output.

However, it is not uncommon that the process automation system may use a voltmeter having an internal resistance of only 100 kΩ. In this case, in the voltage divider formed by the current limiting resistor and the voltmeter, the 4.7 kΩ resistance is not negligible:

$$100 \text{ K}\Omega/(4.7 \text{ k}\Omega + 100 \text{ k}\Omega) = 0.955 \quad (\text{Eq. 2})$$

That is, the voltmeter is able to measure only 95.5% of the 1-5V output. In this example, the 4.7 kΩ resistance has a larger effect and thus may limit the operation of the voltage output circuit. For this reason the current limiting resistor has limited application in the protection of the output circuit.

Accordingly, there remains a need for further contributions in this area of technology.

SUMMARY OF THE INVENTION

The present disclosure discloses a voltage output circuit, including: a control circuit including an output voltage controller, a microcontroller, a DC-DC converter, and at least two input terminals; a differential op-amp having an inverting input and a non-inverting input, wherein an output of the output voltage controller is connected to the non-inverting input; a feed-back loop including a first feed-back resistor and a second feed-back resistor, the first feed-back resistor and the second feed-back resistor forming a voltage divider, wherein a first end of the feed-back loop is connected to an op-amp output and a second end of the feed-back loop is connected to a ground, and wherein between the first feed-back resistor and the second feed-back resistor the feed-back loop is connected to the inverting input; a switch connected to the op-amp output and to an output terminal of the voltage output circuit, wherein the switch is normally open; and a POWERGOOD signal generated by the control circuit and connected to a control input of the switch, wherein an asserted POWERGOOD signal enables the switch to close and an un-asserted POWERGOOD signal enables the switch to open. The switch may include at least one MOSFET, wherein the POWERGOOD signal is connected to a gate of the at least one MOSFET. The switch may include an opto-coupled solid state relay, wherein the POWERGOOD signal is connected to an LED control connection of the opto-coupled solid state relay. In the voltage output circuit, the microcontroller may be enabled to assert and to un-assert the POWERGOOD signal. In the voltage output circuit, the DC-DC converter may be enabled to assert and to un-assert the POWERGOOD signal.

The present disclosure also discloses a transceiver circuit, including: control circuit including a microcontroller, a DC-DC converter, and at least two input terminals; an transceiver device connected to an electromagnetic interference (EMI) filter; a switch connected to the output of the EMI filter and connected to at least two output terminals, wherein the switch is normally open; and a POWERGOOD signal generated by the control circuit and connected to a control input of the switch, wherein an asserted POWERGOOD signal enables the switch to close and an un-asserted POWERGOOD signal enables the switch to open. The switch may include at least one MOSFET, wherein the POWERGOOD signal is connected to a gate of the at least one MOSFET. The switch may include an opto-coupled solid state relay, wherein the POWERGOOD signal is connected to an LED control connection of the opto-coupled solid state relay.

BRIEF DESCRIPTION OF THE DRAWINGS

The described embodiments and other features, advantages, and disclosures contained herein, and the matter of attaining them, will become apparent and the present disclosure will be better understood by reference to the following description of various embodiments of the present disclosure taken in conjunction with the accompanying drawings, wherein.

DETAILED DESCRIPTION

Figure 1:
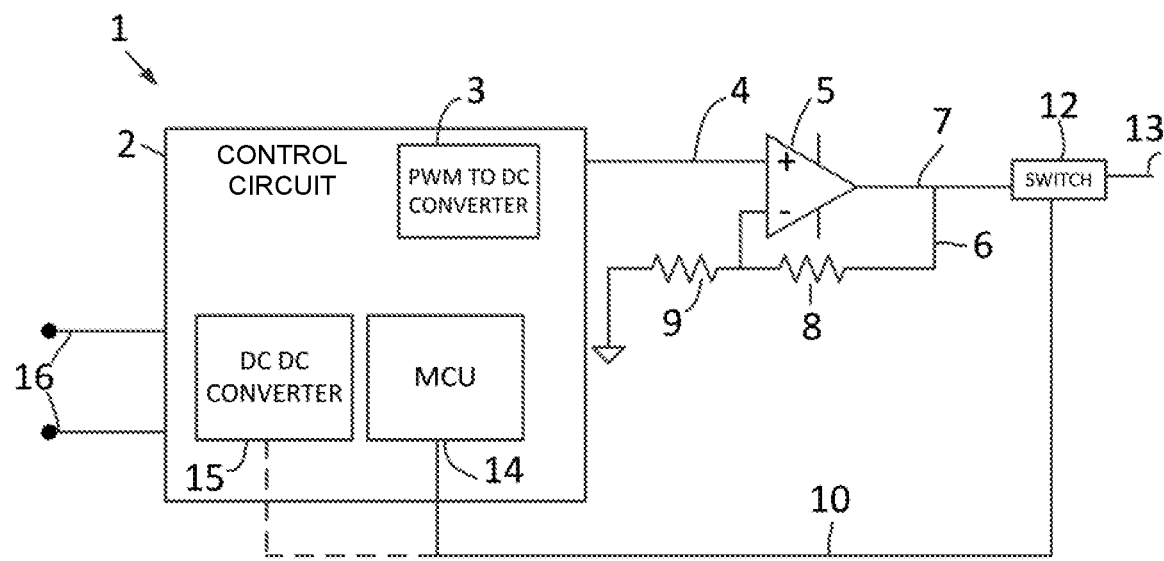
FIG. 1 shows a field device output circuit according to an embodiment of the present disclosure.

The present disclosure discloses a voltage output circuit for a field device for use in a process automation system. The voltage output circuit may be integrated into a field device in a process automation system. Such a field device may be a level measuring device attached to a large storage vessel, for example. Or the field device may be a pressure measuring device attached to a pipe or conduit, as another example. The field device may be embodied to measure a level, a pressure or another such physical quantity and to convert the measured value to an analog voltage between 1 V and 5 V. The analog voltage may be output from the field device via the voltage output circuit 1 to a voltmeter in the process automation system.

For the purposes of promoting an understanding of the principles of the present disclosure, reference will be made to the embodiments illustrated in the drawings, and specific language will be used to describe the same. It will nevertheless be understood that no limitation of the scope of this disclosure is thereby intended.

An embodiment of a voltage output circuit 1 according to the present disclosure is shown in FIG. 1. As shown in FIG. 1, the voltage output circuit 1 may include control circuit 2 embodied to control the voltage output circuit 1. The control circuit 2 may include a microcontroller 14, a DC-DC converter 15, and an output voltage controller 3. The voltage output circuit 1 may further include a differential op-amp 5 configured to supply an output voltage 7 to a switch 12. The op-amp 5 may include a feed-back loop 6 having a feed-back resistor 8 and a feed-back resistor 9 forming a voltage divider. The feed-back loop 6 may be connected to an inverting input of the op-amp 5 at a point between the feed-back resistor 8 and the feed-back resistor 9.

The control circuit 2 may be embodied to convert an analog value from a measuring transducer in the field device (not shown in FIG. 1) to a digital value and to filter, condition, and otherwise process the digital value. The processed digital value may be converted by the output voltage controller 3 to a control voltage 4 for output to a non-inverting input of op-amp 5. The op-amp 5 with its feed-back loop 6 may operate on the control voltage to produce an output voltage 7 in a range of 1 V to 5 V.

An output contact of the switch 12 may be connected to an output terminal 13. The output terminal 13 may be connected to a process automation control loop (not shown in FIG. 1). It is through the switch 12 and the output terminal 13 that the field device's analog output voltage 7 is output to the process automation system. The switch 12 may be normally open and non-conducting. The switch 12 may be controlled by a POWERGOOD signal 10 that is controlled by the microcontroller 14. Alternately, the POWERGOOD signal 10 may be controlled by the DC-DC converter 15. Whether controlled by the DC-DC converter 15 or the microcontroller 14, the operation of the POWERGOOD signal 10 and the switch 12 is as follows. When the POWERGOOD signal 10 is asserted, the switch 12 is closed and enabled to conduct electricity such that the output voltage 7 is conducted to the output terminal 13. Conversely, when the POWERGOOD signal 10 is not asserted, the switch 12 remains open and unable to conduct electricity. When the switch 12 is open, the output of the op-amp 5 is disconnected from the output terminal 13.

Figure 2:
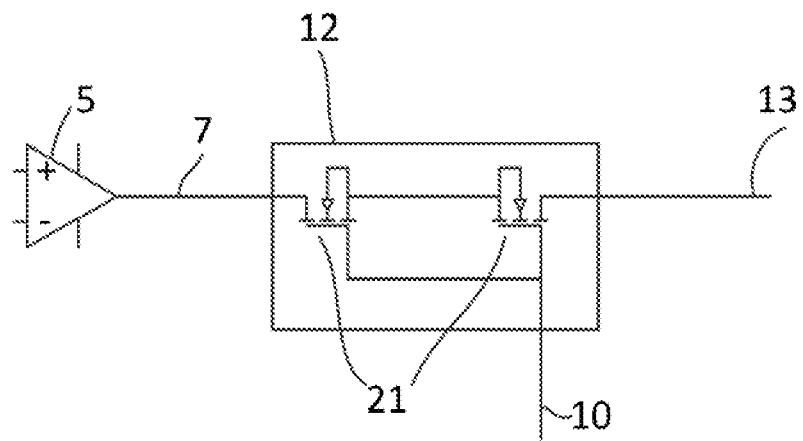
FIG. 2 shows a switch using MOSFETs according to an embodiment of the present disclosure.

The switch 12 may have several embodiments. In an embodiment of the voltage output circuit 1, a portion of which as shown in FIG. 2, the switch 12 may be implemented with one or more n-channel or p-channel MOSFETs 21. In embodiments of the switch 12 that include the MOSFETs 21, the POWERGOOD signal 10 may be connected to a gate of the MOSFETs 21 to control a voltage at the gate. An asserted POWERGOOD signal 10 enables the MOSFETs 21 to conduct electricity through their respective channels and thus connect the output of the op-amp 5 with the output terminal 13. An un-asserted POWERGOOD signal 10 does not enable the MOSFETs 21 to conduct electricity and thus opens the circuit 1 between the output of the op-amp 5 and the output terminals 13.

Figure 3:
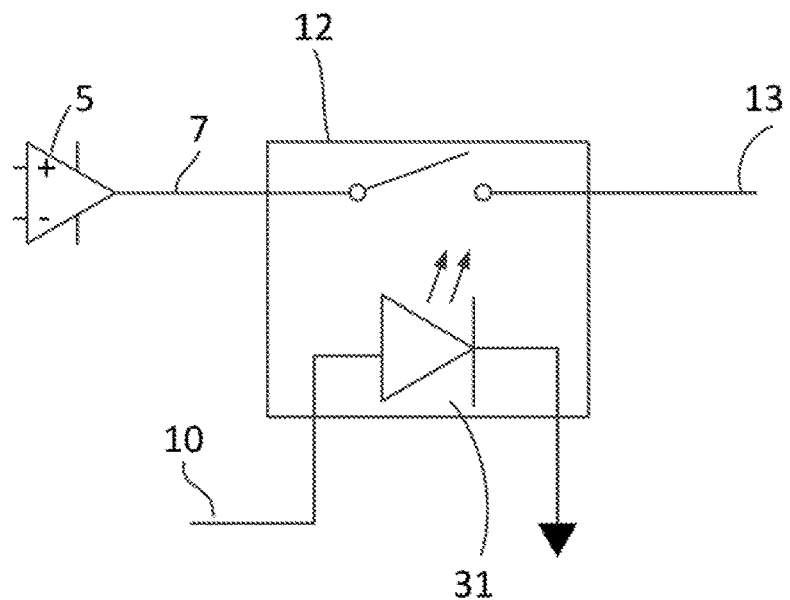
FIG. 3 shows a switch using an opto-coupled solid state relay according to an embodiment of the present disclosure.

In an embodiment of the voltage output circuit 1 as shown in FIG. 3, the switch 12 may be implemented with an opto-coupled solid state relay 31. In such an embodiment, the POWERGOOD signal 10 may be connected to an LED input of the opto-coupled relay 31 and control the LED. An asserted POWERGOOD signal 10 causes the LED in the opto-coupled solid state relay 31 to illuminate and thus closes the switch of the opto-coupled solid state relay 31 to conduct electricity. An un-asserted POWERGOOD signal 10 does not allow the LED in the opto-coupled solid state relay 31 to illuminate, and thus the opto-coupled solid state relay 31 remains open. As with the embodiment of the switch 12 shown in FIG. 2, when the opto-coupled solid state relay 31 is closed, the output voltage 7 from the op-amp 5 is conducted to the output terminal 13. When the opto-coupled solid state relay 31 is open, the output of the op-amp 5 is disconnected from the output terminal 13.

In some embodiments of the control circuit 2 of the voltage output circuit 1, the DC-DC converter 15 is configured to control the POWERGOOD signal 10. For example, the DC-DC converter may be configured to assert the POWERGOOD signal 10 only when the DC-DC converter 15 determines its output voltage is within an expected range. The POWERGOOD signal 10 remains unasserted otherwise. In such embodiments, the DC-DC converter 15 is used as a proxy for the control circuit 2: the asserted POWERGOOD signal 10 indicates the control circuit 2 are operating normally, and the switch 12 can therefore be closed to convey the output voltage 7 from the op-amp 5 to the output terminal 13. The POWERGOOD signal 10 remains unasserted, and the switch 12 remains open when the control circuit 2 are not operating normally.

In some embodiments of the control circuit 2, the microcontroller 14 is configured to control the POWERGOOD signal 10. For example, the microcontroller 14 may be programmed to execute an algorithm to ensure at least parts of the control circuit 2 are operating correctly. This may provide a more robust check of whether the control circuit 2 are operational than a check of the DC-DC converter 15 output would provide. In such embodiments, when the microcontroller 14 determines the control circuit 2 are operating correctly, the microcontroller 14 asserts the POWERGOOD signal to close the switch 12. When the microcontroller 14 is not operating, or when the microcontroller 14 is operating but determines the control circuit 2 are not operating correctly, the POWERGOOD signal remains un-asserted, and the switch 12 therefore remains open.

When a field device including the voltage output circuit 1 is installed in a process automation system, a power supply of up to approximately 35 VDC may be connected to the input terminals 16. However, if instead of being connected to input terminals 16, the power supply were connected mistakenly to the output terminal 13, then the voltage output circuit 1 would not have power for it and its components to operate. Without power, the DC-DC converter 15 would not be operational and would not be able to determine if its output voltage were within the expected range. Without power, the microcontroller 14 would not be able to execute an algorithm to determine whether components of the control circuit 2 were operating correctly. The POWERGOOD signal 10 would remain un-asserted, and the switch 12 would remain open. With the switch 12 remaining open, electric current from the power supply improperly connected to output terminal 13 will not pass beyond the switch 12 to damage any part of the voltage output circuit 1.

Figure 4:
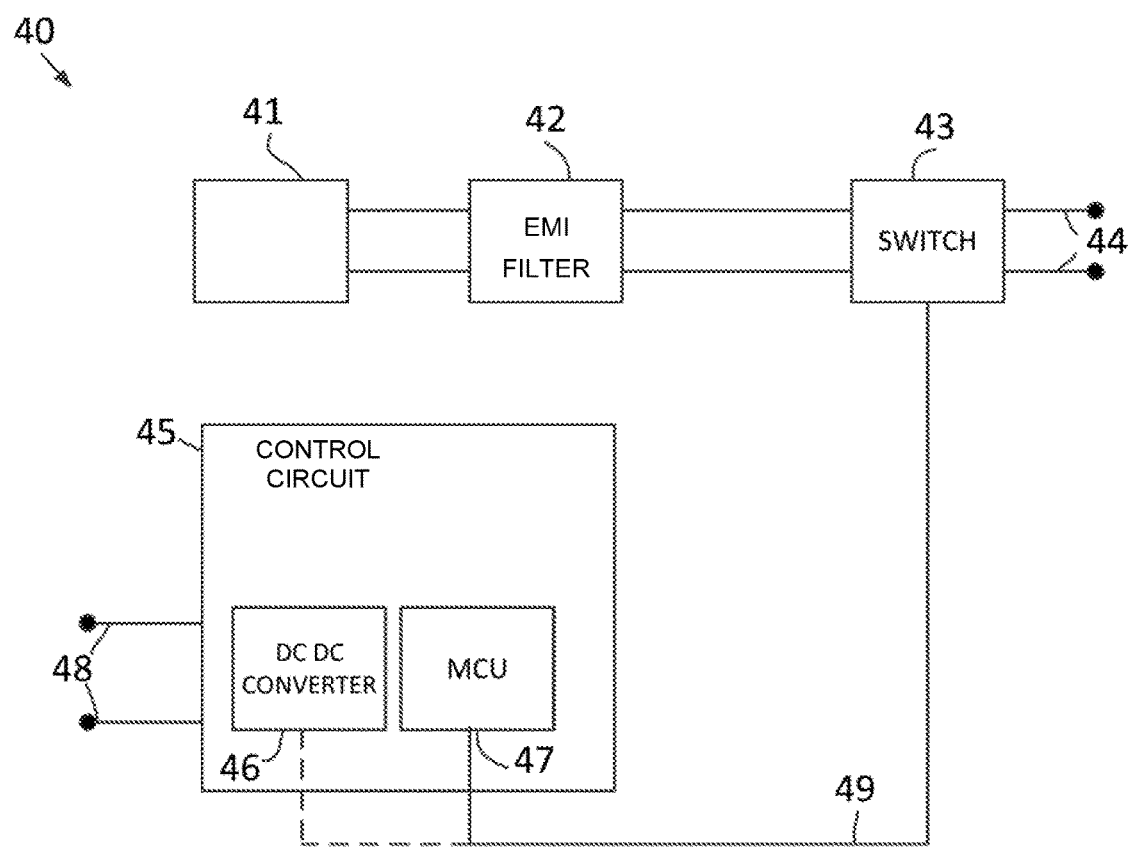
FIG. 4 shows an RS-485 circuit according to an embodiment of the present disclosure.

The disclosed voltage output circuit 1 may also be applied in the context of an RS-485 transceiver circuit of a process automation field device. Such an embodiment is shown in FIG. 4. The RS-485 transceiver circuit 40 may include an RS-485 transceiver 41 connected to electromagnetic interference ("EMI") filters 42. The EMI filters 42 may be connected to switch 43 which is normally open. The output terminals 44 of the switch 43 may be connected to RS-485 communication lines (not shown in FIG. 4).

The RS-485 transceiver circuit 40 may also contain control circuit 45. The control circuit 45 may include a DC-DC converter 46 and a microcontroller 47. The control circuit 45 may further include input terminals 48 for the input of power to the control circuit 45. The control circuit 45 may assert a POWERGOOD signal 49 that is connected with a control input of the switch 43. The switch 43 may be implemented as a MOSFET switch or as an opto-coupled solid state relay.

The operation of the RS-485 transceiver circuit 40 is similar in certain aspects to that of the power output circuit 1 as shown in FIG. 1. In normal operation, a power supply input of up to approximately 35 VDC may be connected to input terminals 48, enabling the control circuit 45 to operate. The operating control circuit 45 may assert the POWERGOOD signal 49 and thereby cause the switch 43 to close. A closed switch 43 enables the RS-485 transceiver 41 to communicate with any RS-485 transceivers connected to output terminals 44.

Conversely, if the power supply input is mistakenly connected to output terminals 44 and not to input terminals 48, then the control circuit 45 will not have electrical power to operate and will be unable to assert the POWERGOOD signal 49. The switch 43 would remain open, and no electrical current could flow into the RS-485 transceiver circuit 1 from the output terminals 44. The open switch 43 prevents any voltage source connected to output terminals 44 from overloading any components of the RS-485 output circuit 40.

While various embodiments of a voltage output circuit have been described in considerable detail herein, the embodiments are merely offered by way of non-limiting examples of the disclosure described herein. It will therefore be understood that various changes and modifications may be made, and equivalents may be substituted for elements and steps thereof, without departing from the scope of the disclosure. Indeed, this disclosure is not intended to be exhaustive or to limit the scope of the disclosure.

What is claimed is:

1. A transceiver circuit, comprising:
   control circuit including a microcontroller, a DC-DC converter, and at least two input terminals;
   a transceiver device connected to an electromagnetic interference (EMI) filter;
   a switch connected to the output of the EMI filter and connected to at least two output terminals of the transceiver circuit, wherein the switch is normally open; and
   a signal generated by the control circuit and connected to a control input of the switch, wherein an asserted signal enables the switch to close and an un-asserted signal enables the switch to open.

2. The transceiver circuit of claim 1, wherein the switch includes at least one MOSFET, and wherein the signal is connected to a gate of the at least one MOSFET.

3. The transceiver circuit of claim 1, wherein the switch includes an opto-coupled solid state relay, and wherein the signal is connected to an LED control connection of the opto-coupled solid state relay.

* * * * *